(12) United States Patent
Kang et al.

(10) Patent No.: US 10,488,474 B2
(45) Date of Patent: Nov. 26, 2019

(54) MAGNETIC RESONANCE IMAGING APPARATUS WITH SPIRALLY EXTENDED MONOPOLE ANTENNA STRUCTURE

(71) Applicant: GACHON UNIVERSITY OF INDUSTRY-ACADEMIC COOPERATION FOUNDATION, Gyeonggi-do (KR)

(72) Inventors: Chang-Ki Kang, Incheon (KR); Hang-Keun Kim, Incheon (KR); Young-Don Son, Incheon (KR); Yeong-Bae Lee, Incheon (KR); Myung-Kyun Woo, Gyeonggi-do (KR)

(73) Assignee: Gachon Univ. of Industry-Academic Coop Foundation, Gyeonggi-Do (KR)

( * ) Notice: Subject to any disclaimer, the term of this patent is extended or adjusted under 35 U.S.C. 154(b) by 284 days.

(21) Appl. No.: 15/496,601

(22) Filed: Apr. 25, 2017

(65) Prior Publication Data

US 2017/0315186 A1    Nov. 2, 2017

(30) Foreign Application Priority Data

Apr. 29, 2016    (KR) .......................... 10-2016-0053509

(51) Int. Cl.
 *G01R 33/34*    (2006.01)
 *G01R 33/36*    (2006.01)
 (Continued)

(52) U.S. Cl.
 CPC ... *G01R 33/34053* (2013.01); *G01R 33/3415* (2013.01); *G01R 33/3685* (2013.01); *G01R 33/422* (2013.01)

(58) Field of Classification Search
 CPC .......... G01R 33/34053; G01R 33/3685; G01R 33/3415; G01R 33/422
 See application file for complete search history.

(56) References Cited

U.S. PATENT DOCUMENTS

| | | | | |
|---|---|---|---|---|
| 3,521,289 A | * | 7/1970 | Mayes ................... | H01Q 1/362 343/806 |
| 5,734,353 A | * | 3/1998 | Van Voorhies ........ | H01Q 11/08 343/742 |

(Continued)

FOREIGN PATENT DOCUMENTS

| | | |
|---|---|---|
| JP | 2008119091 A | 5/2008 |
| JP | 2010042251 A | 2/2010 |

(Continued)

*Primary Examiner* — Dixomara Vargas
(74) *Attorney, Agent, or Firm* — HoustonHogle LLP

(57) ABSTRACT

Disclosed is a magnetic resonance imaging (MRI) apparatus with a spirally extended monopole antenna structure whereby magnetic field homogeneity is improved. The apparatus includes: a cylinder body 110; a plurality of monopole antennas forming an array, the antenna being spirally arranged along a surface of the cylinder body 110 at a predetermined inclination angle relative to a central axis of the cylinder body 110; a ground plate 130 in which ends of the monopole antennas are arranged on one surface of the ground plate 130 in a circular arrangement; and a plurality of coaxial cables 140 in which signal lines thereof are respectively connected to the monopole antennas and ground lines thereof are connected to the ground plate 130.

4 Claims, 3 Drawing Sheets

(51) Int. Cl.
*G01R 33/3415* (2006.01)
*G01R 33/422* (2006.01)

(56) References Cited

U.S. PATENT DOCUMENTS

| | | | | |
|---|---|---|---|---|
| 5,754,143 | A * | 5/1998 | Warnagiris | H01Q 1/36 343/746 |
| 5,952,978 | A * | 9/1999 | VanVoorhies | H01Q 11/12 343/742 |
| 6,094,178 | A * | 7/2000 | Sanford | H01Q 1/242 343/860 |
| 6,239,760 | B1 * | 5/2001 | Van Voorhies | H01Q 11/08 343/742 |
| 6,859,181 | B2 * | 2/2005 | Colburn | H01Q 1/3275 343/713 |
| 7,262,739 | B2 * | 8/2007 | Chen | H01Q 1/362 343/700 MS |
| 7,339,542 | B2 * | 3/2008 | Lalezari | H01Q 5/00 343/730 |
| 7,609,226 | B1 * | 10/2009 | MacGahan | H01Q 11/08 343/846 |
| 8,081,113 | B2 * | 12/2011 | Yu | H01Q 9/0464 343/700 MS |
| 9,130,274 | B1 * | 9/2015 | Vincent | H01Q 9/32 |
| 9,281,564 | B2 * | 3/2016 | Vincent | H01Q 7/00 |
| 10,058,387 | B2 * | 8/2018 | Rossetto | A61B 18/1815 |
| 2004/0263406 | A1 * | 12/2004 | Colburn | H01Q 1/3275 343/725 |
| 2007/0030199 | A1 * | 2/2007 | Chen | H01Q 1/362 343/700 MS |
| 2007/0132650 | A1 * | 6/2007 | Lalezari | H01Q 5/00 343/773 |
| 2008/0158066 | A1 * | 7/2008 | Yu | H01Q 9/0457 343/700 MS |
| 2011/0210900 | A1 * | 9/2011 | Vincent | H01Q 7/00 343/793 |
| 2015/0285876 | A1 | 10/2015 | Habara et al. | |
| 2016/0302862 | A1 * | 10/2016 | Rossetto | A61B 18/1815 |
| 2018/0258759 | A1 * | 9/2018 | Gooneratne | E21B 47/122 |
| 2018/0306028 | A1 * | 10/2018 | Gooneratne | E21B 47/122 |

FOREIGN PATENT DOCUMENTS

| | | |
|---|---|---|
| JP | 2013526365 B2 | 6/2013 |
| JP | 2014508622 | 4/2014 |
| KR | 10-1437777 B1 | 9/2014 |
| KR | 10-2015-0033440 A | 1/2015 |
| KR | 101611451 B1 | 4/2016 |
| WO | 2011146153 A1 | 11/2011 |
| WO | 2012127341 A1 | 9/2012 |
| WO | 2014073406 A1 | 9/2016 |

* cited by examiner

MAGNETIC RESONANCE IMAGING APPARATUS WITH SPIRALLY EXTENDED MONOPOLE ANTENNA STRUCTURE

CROSS REFERENCE TO RELATED APPLICATION

The present application claims priority to Korean Patent Application No. 10-2016-0053509, filed Apr. 29, 2016, the entire contents of which is incorporated herein for all purposes by this reference.

BACKGROUND OF THE INVENTION

Field of the Invention

The present invention generally relates to a magnetic resonance imaging (MRI) apparatus. More particularly, the present invention relates to a MRI apparatus with a spirally extended monopole antenna structure whereby magnetic field homogeneity is improved.

Description of the Related Art

MRI is an imaging technique that images magnetic resonance signals by reconfiguring the received signals using a computer. The magnetic resonance signals are generated by applying a high frequency radio frequency (RF) pulse to magnetization vectors of nuclides (hydrogen, phosphorus, sodium, carbon, etc.) that are present in the body within a uniform main magnetic field, and by rearranging the magnetization vectors in vertical planes by resonating a specific nuclide (hydrogen, etc.).

Generally, pulse transmissions for resonating magnetization vectors and receptions of the generated magnetic resonance signals are performed by RF coils. Herein, RF coils for resonating magnetization vectors (RF transmission mode) and RF coils for receiving generated magnetic resonance signals (RF receiving mode) may be respectively provided. Alternatively, a single RF coil may be used for the RF transmission mode and the RF receiving mode.

Generally, when a magnitude of the main magnetic field becomes larger, a sensitivity of MRI increases, and an approximated SNR (signal to noise ratio) is proportional to the magnitude of the main magnetic field. Accordingly, in order to obtain a more detailed image, research and development in large magnetic field imaging systems have been actively carried out. Particularly, ultra high field 7.0 T MRI systems for the human body have been introduced due to the need for high-resolution images used in the brain science field.

Meanwhile, in spite of many advantages of ultra high field imaging systems, there are technical problems to be solved. Among them, RF coil problems are the main issue.

In detail, in ultra high field MRI, an RF wavelength becomes short when an RF signal with a high frequency is used. Accordingly, while designing RF coils, a phase shift, a parasitic capacitance, radiation loss, etc., may be considered. Thus, RF coil design becomes considerably complicated.

In addition, within RF coils, magnetic field inhomogeneity hinders the improvement of the sensitivity of MRI. Accordingly, a method of correcting a transmission wave, a method of using high dielectric constant pads, etc., are used for obtaining uniform magnetic field of RF coils.

Methods used for correcting transmission waves uniformly correct intensity and phase by using a multi-channel transceiver device. However, the manufacturing cost increases since additional attenuators and phase adjusters are required for each device.

Meanwhile, high dielectric constant pads using an RF magnetic field that is influenced by displacement currents of high dielectric constant materials have other disadvantages, such as the fact that high dielectric constant pads should require water or high dielectric constant materials between a target and coil, and the long amount of time to excite spin inside the target.

In order to solve the above problems, as a conventional technique, Korean Patent No. 10-1437777 (Publication date: Sep. 17, 2014) proposes a MRI apparatus using an RF coil and applying a monopole antenna structure thereto.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 10-1437777 (Publication date: Sep. 17, 2014)

SUMMARY OF THE INVENTION

Accordingly, the present invention has been made keeping in mind the above problems occurring in the related art, and the present invention is intended to provide a MRI apparatus. More particularly, the present invention relates to providing a MRI apparatus with a spirally extended monopole antenna structure that improves magnetic field homogeneity.

In order to achieve the above object, according to one aspect of the present invention, there is provided a MRI apparatus with a spirally extended monopole antenna structure, the apparatus including: a cylinder body; a plurality of monopole antennas forming an array, the antennas spirally arranged along a surface of the cylinder body at a predetermined inclination angle relative to a central axis of the cylinder body and; a ground plate in which ends of the monopole antennas are arranged on one surface of the ground plate in a circular arrangement; and a plurality of coaxial cables in which signal lines thereof are respectively connected to the monopole antennas and ground lines thereof are connected to the ground plate.

Preferably, the apparatus may further include conductive shielding members disposed between the monopole antennas.

Preferably, each of the shielding members may be a conductive strip arranged to be perpendicular to the cylinder body.

Preferably, the shielding members may be spirally arranged along the surface of the cylinder body at the same angle as the monopole antennas.

According to a MRI apparatus of the present invention, magnetic field homogeneity is improved, and high resolution images are obtained based on a high SNR in comparison with the conventional art, by including monopole antennas spirally arranged along a surface of the cylinder body at a predetermined inclination angle relative to a central axis of the cylinder body.

In addition, the present invention has an effect of obtaining data through various imaging methods since magnetic field inhomogeneity in a z-axis occurring in multi-channel transceiver monopole antennas is improved.

In addition, the present invention has an advantage in data processing speed since images that are obtained by using general imaging techniques are obtained without post-processing such as field inhomogeneity correction. In addition, the present invention may not be greatly restricted in being combined with other imaging techniques such as functional magnetic resonance imaging (fMRI) or magnetic resonance angiography (MRA).

It will be appreciated by persons skilled in the art that the effects that could be achieved with the present invention are not limited to what has been specifically described hereinabove and other advantages of the present invention will be more clearly understood from the following detailed description.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Specific structural and functional descriptions of embodiments of the present invention disclosed herein are only for illustrative purposes of the embodiments of the present invention. The embodiments according to the spirit and scope of the present invention can be variously modified in many different forms. While the present invention will be described in conjunction with exemplary embodiments thereof, it is to be understood that the present description is not intended to limit the present invention to those exemplary embodiments. On the contrary, the present invention is intended to cover not only the exemplary embodiments, but also various alternatives, modifications, equivalents and other embodiments that may be included within the spirit and scope of the present invention as defined by the appended claims.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to", or "directly adjacent to" should be construed in the same way.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Hereinbelow, embodiments of the present invention are described in detail with reference to the accompanying drawings as follows.

Figure 1:
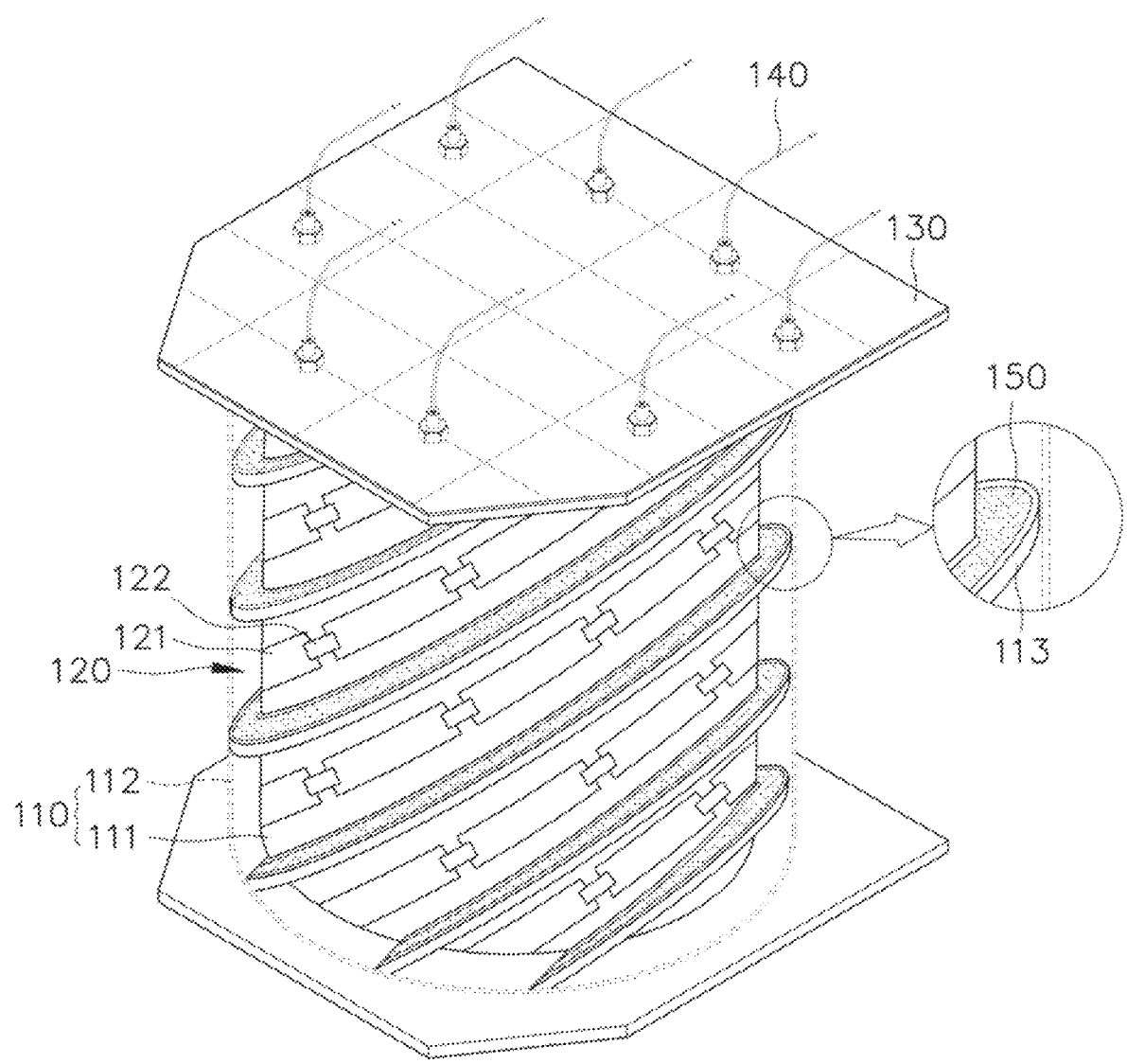
FIG. 1 is a perspective view of a magnetic resonance imaging (MRI) apparatus according to the present invention.

FIG. 1 is a perspective view of a magnetic resonance imaging (MRI) apparatus according to the present invention.

Referring to FIG. 1, the MRI apparatus according to the present invention includes: a cylinder body 110; a plurality of monopole antennas 120 forming an array, the antennas 120 are spirally arranged along a surface of the cylinder body 110 at a predetermined inclination angle relative to a central axis of the cylinder body 110; a ground plate 130 in which ends of the monopole antennas 120 are arranged on one surface of the ground plate 130 in a circular arrangement; and a plurality of coaxial cables 140 in which signal lines thereof are respectively connected to the monopole antennas 120, and ground lines thereof are connected to the ground plate 130.

Both sides of the cylinder body 110 are open, and the ground plate 130 is fixed to one open part of the cylinder body 110, and a structure such as a monopole antenna 120 is fixed along an outer circumference surface of the cylinder body 110.

In the present embodiment, the cylinder body 110 is configured with an inner cylinder 111 and an outer cylinder 112 disposed at the outside of the inner cylinder 111. Preferably, the cylinder body 110 may be made of an acryl, but it is not limited thereto.

The monopole antennas 120 are fixed to the cylinder body 110. Herein, each of the monopole antennas 120 is provided with a plurality of conductive members. Preferably, each of the monopole antennas 120 may be provided with a plurality of conductive segments 121 that is connected by a capacitor 122 with each other.

The ground plate 130 may be provided with an acrylic plate with a copper plate on one surface thereof. In one surface of the ground plate 130, ends of the monopole antennas 120 may be vertically arranged in a circular arrangement. In addition, in another surface of the ground plate 130, a plurality of coaxial cables 140 associated with respective monopole antennas 120 is provided.

The copper plate that is attached on the ground plate 130 may be provided with separate multiple pieces of copper plates to reduce eddy currents.

The coaxial cables 140 are connected to respective monopole antennas 120 with associated signal lines thereof, and are grounded by being connected to the ground plate 130 with ground lines thereof. Each of the coaxial cable 140 transceives RF signals by being connected to a RF transceiver part that is not shown in the figure.

Preferably, shielding members 150 are provided between the monopole antennas 120. Each of the shielding members 150 may be provided with a conductive strip.

In the present embodiment, the shielding members 150 are spirally arranged to be perpendicular to the surface of the cylinder body 110. Preferably, the shielding members 150 are fixed to a supporting plate 113 that is spirally fixed between the inner cylinder 111 and the outer cylinder 112. As the supporting plate 113, a resin such as acryl may be used as like the cylinder body 110.

Figure 2:
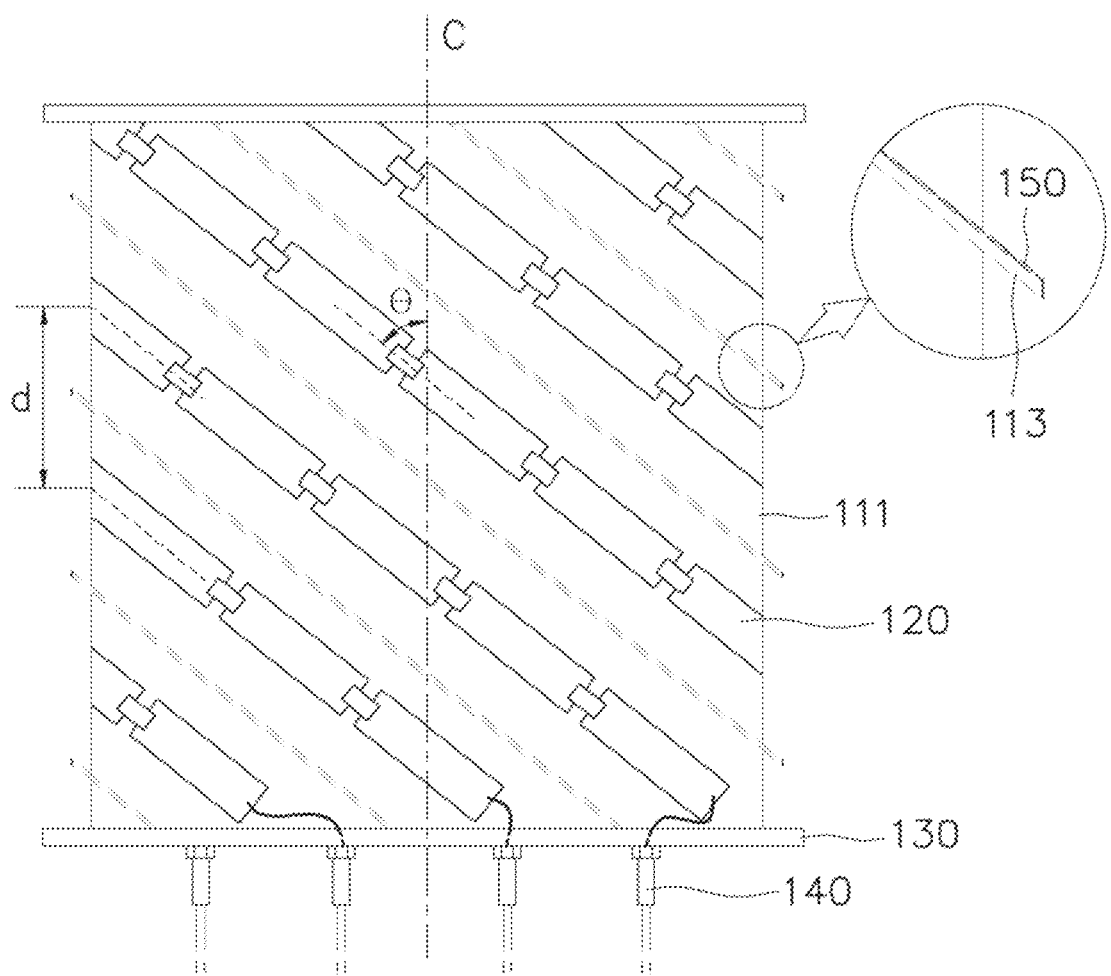
FIG. 2 is a front view of the MRI apparatus according to the present invention.

FIG. 2 is a front view of the MRI apparatus according to the present invention. Herein, the outer cylinder is now shown.

Referring to FIG. 2, the monopole antennas 120 are spirally fixed along a surface of the inner cylinder 111 at a predetermined angle θ relative to a central axis C. The two adjacent monopole antennas 120 are spaced apart from each other by a predetermined distance d in a direction of the central axis C.

Example Embodiment

Figure 3A:
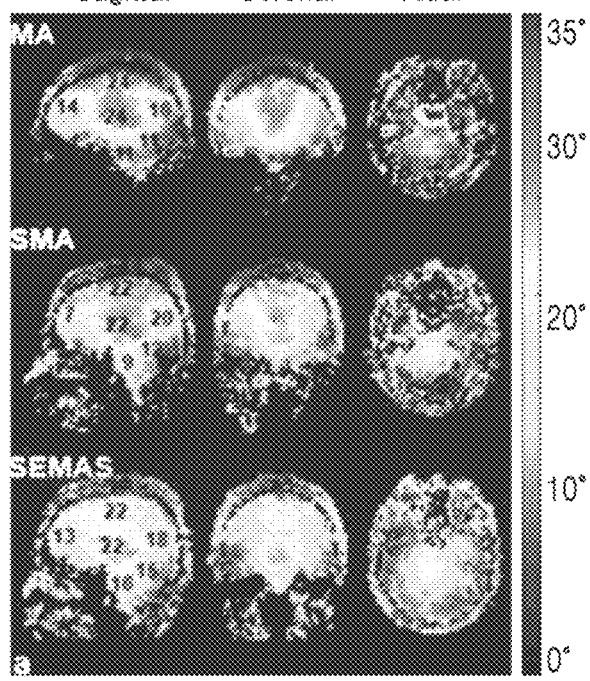
FIGS. 3A and 3B are brain magnetic resonance images taken by a comparative example and by the MRI apparatus according to the present invention.
Figure 3B:
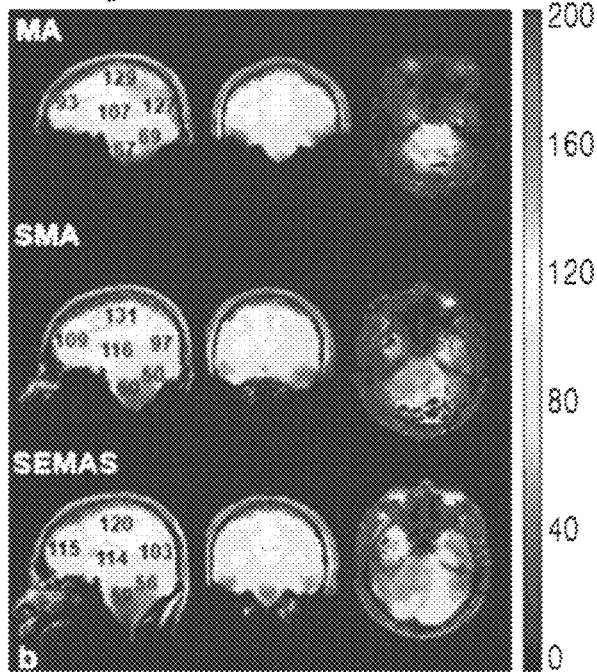

FIGS. 3A and 3B are brain magnetic resonance images taken by a comparative example according to the present invention. FIG. 3A shows measured flip angle maps of a brain, and FIG. 3B shows receive sensitive maps. In each figure, MA, SMA, and SEMAS are images of comparative examples: MA shows images of an example of monopole antennas (hereinafter, referred to a "comparative example"), SMA shows images of an example of spirally extended monopole antennas that corresponds to the present invention (hereinafter, referred to as "embodiment 1"), and SEMAS shows images of an example of spirally extended monopole antennas with shielding members (hereinafter, referred to as "embodiment 2"). In the embodiments and the comparative example of the present invention, an array of eight monopole antennas that are spaced apart from each other by an identical distance is used, and a 7 T MRI scanner (Siemens Medical Solutions, Erlangen, Germany) is used for the experiment.

In order to compare flip angle distributions, an AFI (actual flip angle imaging) pulse sequence (TR1/TR2=20/100 ms and TE=3.1 ms, Bandwidth=300 Hz/pixel) is obtained. In order to investigate a SNR (signal to noise ratio) of each antenna array, proton density-weighted images (TR=100 ms, TE=2.5 ms) of a sagittal plane, a coronal plane, and an axial plane are obtained. Reference voltages for images of respective embodiments are 240V.

FIG. 3A shows specific ROIs (region of interest) of the sagittal plane in degrees. Among the three antenna arrays, a difference in the maximum standard deviation of the same ROI is found in the occipital lobe. However, the flip angle measured in embodiment 2 (SEMAS) is actually larger than those of the comparative example (MA) and embodiment 1 (SMA). Average flip angles of the comparative example, embodiment 1, and embodiment 2 are 8°, 11°, and 16°, respectively, and the angle of embodiment 2 is the largest. The standard deviations of the measured flip angles of the three antenna arrays differ significantly with each other (comparative example: 36, embodiment 1: 22, embodiment 2: 36).

Similar results are obtained for measured flip angles of the coronal plane and axial plane as the sagittal plane. Embodiment 2 shows the largest flip angle.

Accordingly, in the present invention, magnetic field inhomogeneity is improved in comparison with the monopole antennas of the comparative example. Particularly, the monopole antennas with the shielding members have the best magnetic field homogeneity.

Accordingly, the present invention whereby the magnetic field homogeneity is improved may improve analysis, for example, in a situation where blood vessels at several specific positions are emphasized and thus an inhomogeneous magnetic field in magnetic resonance angiography largely occurs while processing MIP (maximal intensity projection).

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A magnetic resonance imaging (MM) apparatus with a spirally extended monopole antenna structure, the apparatus comprising:
    a cylinder body;
    a plurality of monopole antennas forming an array, the antennas spirally arranged along a surface of the cylinder body at a predetermined inclination angle relative to a central axis of the cylinder body;
    a ground plate in which ends of the monopole antennas are arranged on one surface of the ground plate in a circular arrangement;
    a plurality of coaxial cables in which signal lines thereof are respectively connected to the monopole antennas and ground lines thereof are connected to the ground plate; and
    conductive shielding members disposed between the monopole antennas.

2. The apparatus of claim 1, wherein each of the shielding members is a conductive strip arranged to be perpendicular to the cylinder body.

3. The apparatus of claim 1, wherein the shielding members are spirally arranged along the surface of the cylinder body at the same angle as the monopole antennas.

4. The apparatus of claim 2, wherein the shielding members are spirally arranged along the surface of the cylinder body at the same angle as the monopole antennas.

* * * * *

UNITED STATES PATENT AND TRADEMARK OFFICE
CERTIFICATE OF CORRECTION

PATENT NO. : 10,488,474 B2
APPLICATION NO. : 15/496601
DATED : November 26, 2019
INVENTOR(S) : Chang Ki Kang et al.

It is certified that error appears in the above-identified patent and that said Letters Patent is hereby corrected as shown below:

In the Claims

Claim 1, Column 6, Line 26, replace "A magnetic resonance imaging (MM) apparatus with a" with
-- A magnetic resonance imaging (MRI) apparatus with a --

Signed and Sealed this
Fourth Day of February, 2020

Andrei Iancu
*Director of the United States Patent and Trademark Office*